(12) United States Patent
Shi (10) Patent No.: US 10,119,993 B2
(45) Date of Patent: Nov. 6, 2018

(54) TESTING PROBE AND SEMICONDUCTOR TESTING FIXTURE, AND FABRICATION METHODS THEREOF

(71) Applicant: TONGFU MICROELECTRONICS CO., LTD., Nantong (CN)

(72) Inventor: Lei Shi, Nantong (CN)

(73) Assignee: TONGFU MICROELECTRONICS CO., LTD., Nantong (CN)

( * ) Notice: Subject to any disclaimer, the term of this patent is extended or adjusted under 35 U.S.C. 154(b) by 253 days.

(21) Appl. No.: 14/926,961

(22) Filed: Oct. 29, 2015

(65) Prior Publication Data

US 2016/0124017 A1    May 5, 2016

(30) Foreign Application Priority Data

Oct. 30, 2014   (CN) .......................... 2014 1 0603672
Oct. 30, 2014   (CN) .......................... 2014 1 0603784

(51) Int. Cl.
  *G01R 1/067*  (2006.01)
  *G01R 3/00*  (2006.01)

(52) U.S. Cl.
  CPC ........... *G01R 1/06733* (2013.01); *G01R 3/00* (2013.01)

(58) Field of Classification Search
  None
  See application file for complete search history.

(56) References Cited

U.S. PATENT DOCUMENTS

| | | | | |
|---|---|---|---|---|
| 3,350,500 A | * | 10/1967 | Ziegler, Jr. ........... | H01R 4/5033 174/88 C |
| 4,996,478 A | * | 2/1991 | Pope ........................ | G01R 1/04 324/755.02 |
| 5,167,545 A | * | 12/1992 | O'Brien ................. | H01R 4/723 439/578 |
| 6,053,777 A | * | 4/2000 | Boyle ...................... | G01R 1/06 439/482 |
| 6,275,054 B1 | * | 8/2001 | Boyle ................. | G01R 1/06722 324/72.5 |
| 6,370,426 B1 | * | 4/2002 | Campbell ............ | A61B 5/0531 324/696 |
| 7,033,934 B2 | * | 4/2006 | Iijima ............... | H01L 23/49827 257/E23.067 |
| 2005/0280432 A1 | * | 12/2005 | Kang .................. | G01R 1/06733 324/755.01 |
| 2009/0215306 A1 | * | 8/2009 | Hanks .................. | H01R 4/5033 439/427 |

FOREIGN PATENT DOCUMENTS

| | | |
|---|---|---|
| CN | 101713790 A | 5/2010 |
| CN | 201805052 U | 4/2011 |

* cited by examiner

*Primary Examiner* — Paresh H Patel
(74) *Attorney, Agent, or Firm* — Anova Law Group, PLLC (57) ABSTRACT

Testing probe and semiconductor testing fixture, and their fabrication methods are provided. A plurality of first testing pins is formed on the substrate, each first testing pin including a first testing terminal on a top and a first connection terminal on a bottom. An insulating layer is formed on a sidewall surface of each first testing pin. A number of second testing pins are formed on the insulating layers, each second testing pin including a second testing terminal on a top thereof and a second connection terminal on a bottom thereof. A first concave surface is formed on a top of the second testing terminal, and surrounds a corresponding first testing pin.

9 Claims, 7 Drawing Sheets

TESTING PROBE AND SEMICONDUCTOR TESTING FIXTURE, AND FABRICATION METHODS THEREOF

CROSS-REFERENCES TO RELATED APPLICATIONS

This application claims the priority of Chinese patent application No. 201410603672.1, filed on Oct. 30, 2014, and Chinese patent application No. 201410603784.7, filed on Oct. 30, 2014, the entirety of all of which is incorporated herein by reference.

FIELD OF THE INVENTION

The present invention generally relates to the field of semiconductor testing technology and, more particularly, relates to a testing probe and a semiconductor testing fixture, and their fabricating methods.

BACKGROUND

A testing process is a procedure to test electrical performance of a product after integrated circuits (ICs) are packaged. The process is to ensure the integrity of performance of the manufactured IC products and classify the tested products according to their electrical performance which can be further used as credentials to sort out the IC products into different grades. In addition, the testing process is also used to inspect appearance of the products.

The aim of electrical performance test is to ensure normal operation of final products by testing various electrical parameters of the products.

Traditional tests, such as Kelvin test, use two contact points on a same terminal to be tested. Double ejector pins or double connecting fingers are placed side by side in parallel with each other. However, there are certain drawbacks as follows.

First, the fabrication precision is low. With continuous decrease of the size of semiconductor products, the size of terminal to be tested and the distance between different terminals to be tested are also getting smaller. Following this trend, limitation of traditional methods with double parallel ejector pins or connecting fingers placed side by side having a fine-pitch arrangement becomes more evident. Precision requirements become higher and higher and some of them may not even possibly meet the precision requirements.

Second, structural strength is weak. As ejector pins or connecting fingers become thinner and thinner to realize double-contact tests within a limited space of terminals to be tested, the mechanical structural strength also becomes weaker and weaker.

Third, service lifetime is short. Traditional ejector pins or connecting fingers may be easily worn and torn, especially in the case that the precision requirement gets higher while the mechanical strength becomes relatively weaker, the degree of abrasion is more significant, and thus the service lifetime of testing fixture is reduced.

Fourth, precision of test or measurement resolution is low. As ejector pins or connecting fingers become thinner and thinner to meet the development requirement for slim and light semiconductor components, their resistance also becomes larger, thus during high current test, a large voltage drop may be induced and it further affects accuracy of test data. Moreover, double parallel ejector pins or connecting fingers may easily induce a measurement error in the test data due to their displacement deviation. In addition, traditional double parallel ejector pins use a method of two back-to slope contacts to reduce the distance between the two pins. The contact head may be pushed to rotate off from the terminal to be tested due to a twisting force caused by stretching or compressing the spring in the structure of the pin, and thus affect the precision of test.

When terminal to be tested has a spherical shape, performing tests on the electrical properties may not be possible using traditional double parallel ejector pins or connecting fingers.

The disclosed testing probe and semiconductor testing fixture, and their fabrication methods are directed to solve one or more problems set forth above and other problems in the art.

BRIEF SUMMARY OF THE DISCLOSURE

The present disclosure includes a method for fabricating a testing probe by providing a substrate. A plurality of first testing pins is formed on the substrate, each first testing pin including a first testing terminal on a top thereof and a first connection terminal on a bottom thereof. An insulating layer is formed on a sidewall surface of each first testing pin. A number of second testing pins are formed on the insulating layers, each second testing pin including a second testing terminal on a top thereof and a second connection terminal on a bottom thereof. A first concave surface is formed on a top of the second testing terminal, and surrounds a corresponding first testing pin.

The present disclosure also includes a method for fabricating a semiconductor testing fixture by providing a substrate containing signal transmission circuits formed inside. A plurality of first testing pins is formed on the substrate, each first testing pin including a first testing terminal on a top thereof and a first connection terminal on a bottom thereof. An insulating layer is formed on a sidewall surface of each first testing pin. A number of second testing pins are formed on the insulating layers, each second testing pin including a second testing terminal on a top thereof and a second connection terminal on a bottom thereof. A first concave surface is formed on a top of the second testing terminal, and surrounds a corresponding first testing pin.

The present disclosure also includes a testing probe. The testing probe includes a first testing pin including a first testing terminal on a top thereof and a first connection terminal on a bottom thereof, an insulating layer covering a sidewall surface of the first testing pin, and a second testing pin on a surface of the insulating layer and including a second testing terminal on a top of the second testing pin and a second connection terminal on a bottom of the second testing pin. A first concave surface is formed on a top of the second testing pin, and surrounds the first testing pin.

The present disclosure also includes a semiconductor testing fixture, including a substrate and a plurality of disclosed testing probes.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings.

As described above in the background section, the performance of existing ejector pins or connecting fingers needs to be improved. In view of this, the present disclosure provides a testing probe. The testing probe includes a first testing pin, an insulating layer covering the side surface of the first testing pin, and a second testing pin surrounding the first testing pin and covering the surface of the insulating layer. The first testing pin further includes a first testing terminal located on the top and a first connection terminal located on the bottom thereof. The second testing pin also includes a second testing terminal located on the top and a second connection terminal located on the bottom thereof. The second testing pin and the first testing pin form a coaxial structure, and a first concave surface is formed on the top of the second testing pin.

The disclosed testing probe integrates the first testing pin and the second testing pin onto a single testing probe with the second testing pin surrounding the first testing pin. With an insulating layer separating the first testing pin and the second testing pin, the disclosed testing probe ensures a compacted size of the probe. In the meantime, it also improves the mechanical strength of the testing probe. Moreover, the first testing pin and the second testing pin form a coaxial structure, the distance between the first testing pin and the second testing pin is relatively accurate, thus the precision of test is improved. In addition, compared to multiple testing pins (for example, double ejector pins or connecting fingers) required in the current technology for performing electrical property tests, a single testing probe of the present disclosure alone can be used to complete such tests on electrical properties. Further, the first concave surface on the testing terminal of the second testing pin may work in connection with the convex surface of a spherical terminal to be tested. Thus when performing tests on electrical properties, the second testing pin may contact well with the spherical surface of the terminal to be tested, therefore the precision of test is improved.

In the following, detailed description of exemplary embodiments will be given with reference drawings. For convenience and clarity, the reference drawings show schematic views of the corresponding semiconductor structures and may be partially enlarged instead of keeping a regular scaling ratio.

Figure 1:
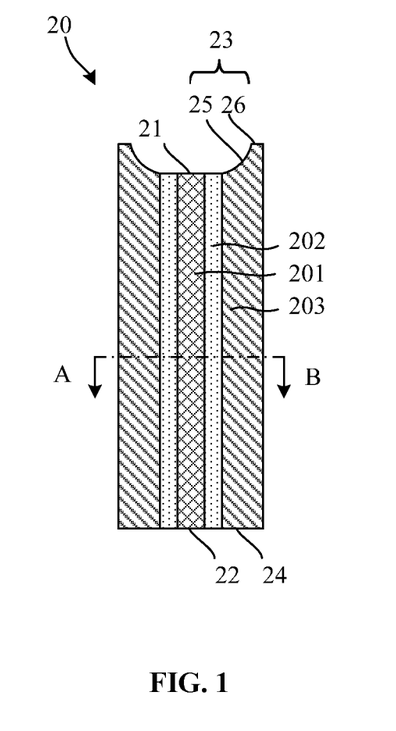
FIG. 1 illustrates a schematic cross-section view of a testing probe according to various disclosed embodiments of the present disclosure.

FIG. 1 shows a schematic cross-section view of a testing probe in one embodiment of the present disclosure.

Referring to FIG. 1, the present disclosure provides a testing probe 20. The testing probe 20 includes:

a first testing pin 201 including a first testing terminal 21 located on the top and a first connection terminal 22 located on the bottom;

an insulating layer 202 covering the side surface of the first testing pin 201; and a second testing pin 203, covering the surface of the insulating layer 202 and surrounding the first testing pin 201, including a second testing terminal 23 located on the top and a second connection terminal 24 located on the bottom.

The second testing pin 203 and the first testing pin 201 form a coaxial structure and a first concave surface 25 is formed on the top of the second testing pin 23 as shown in FIG. 1.

In one embodiment, the surface of the first testing terminal 21 of the first testing pin 201 and the top surface of the insulating layer 202 are lower than the surface of the second testing terminal 23 of the second testing pin 203. The surface of the first testing pin 201 and the top surface of the insulating layer 203 are both flat and the surface of the first testing terminal 21 is leveled (or coplanar) with the top surface of the insulating layer 202. One edge of the first concave surface 25 is in contact with an edge of the insulating layer 202 while the other edge of the first concave surface 25 is in contact with the top surface of the second testing pin 203. That is, the first concave surface 25 extends obliquely up from the edge of the insulating layer 202 to the top surface of the second testing pin 203.

In one embodiment, the second testing terminal 23 includes the first concave surface 25 and a flat surface 26 located on the top of the second testing pin 203. In another embodiment, the second testing terminal 23 may include only the first concave surface 25.

In one embodiment, the top surface of the second testing pin 203 is the flat surface 26. In another embodiment, the top surface of the second testing pin 203 is a curved line coinciding with the sidewall (the outer sidewall) of the second testing pin 203. Thus, one edge of the first concave surface 25 is in contact with the edge of the insulating layer 202 while the other edge of the first concave surface 25 is in contact with the sidewall (the outer sidewall) of the second testing pin 203. That is, the first concave surface 25 extends obliquely up from the edge of the insulating layer 202 to the top surface and/or the outer sidewall of the second testing pin 203.

In one embodiment, the surface of the first testing terminal 21 and the surface of the second testing terminal of the testing probe 20 together form a surface of a near sphere, ellipsoid, or spheroid, thus the testing probe 20 of the present disclosure may be used to test terminals on a shape including sphere, ellipsoid, or spheroid. During electrical property tests, the first testing terminal 21 of the first testing pin 201 is in contact with the surface of a first target of the sphere, ellipsoid, or spheroid to be tested while the first concave surface 25 of the second testing terminal 23 is in contact with the surface of a second target of the sphere, ellipsoid, or spheroid. The surface of the second target is located in a region near the surface of the first target. In addition, during testing, the first testing pin 201 and the second testing pin 203 form excellent surface contacts with the sphere, ellipsoid, or spheroid to be tested, thus the contact area between the testing probe 20 and the sphere, ellipsoid, or spheroid to be tested is increased, therefore the results of the electrical property test can precisely reflect the actual electrical properties of the sphere, ellipsoid, or spheroid to be tested and to improve the precision of test.

In one embodiment, the radian of the first concave surface 25 is equal to or substantially equal to the radian of the surface of the sphere, ellipsoid, or spheroid to be tested to further improve the precision of test.

Figure 2:
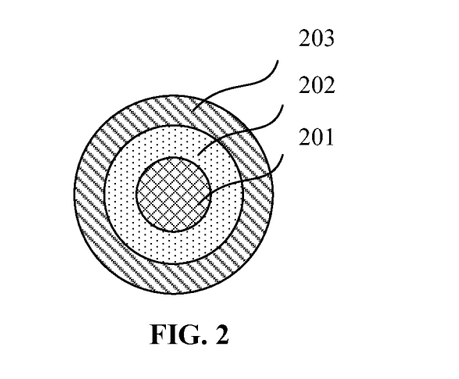
FIG. 2 illustrates a cross-section view of FIG. 1 along a line A-B according to various disclosed embodiments of the present disclosure.

FIG. 2 shows a cross-section view of the structure shown in FIG. 1 along a direction of line A-B in FIG. 1. Referring to FIG. 1 and FIG. 2, in one embodiment, the first testing pin 201 is a cylinder. Accordingly, the cross-section of the first testing pin 201 is a circle; the cross-section of the insulating layer 202 is a circular ring; and the cross-section of the second testing pin 203 is also a circular ring.

In other embodiments, the cross-section of the first testing pin may have a different shape. For example, the cross-section of the first testing pin can be a polygon such as triangle or square.

The testing probe 20 of the present disclosure is formed by a semiconductor integrated manufacturing process, thus the diameter of the first testing pin 201 may be formed relatively small. In one embodiment, the diameter of the first testing pin 201 is in a range of 100 nm-500 µm and may be in a range of 100 nm-10 µm.

Accordingly, the width of the insulating layer 202 and the width of the second testing pin 203 may also be small. In one embodiment, the width of the insulating layer 202 is in a range of 80 nm-400 µm and may be a range of 80 nm-5 µm, while the width of the second testing pin 203 is in a range of 60 nm-300 µm and may be a range of 80 nm-15 µm.

In other embodiments, the diameter of the first testing pin 201, the width of the insulating layer 202, and the width of the second testing pin 203 may be any appropriate value.

The insulating layer 202 is used to electrically isolate the first testing pin 201 from the second testing pin 203. In one embodiment, the top surface of the insulating layer 202 and the top surface of the first testing pin 201 (e.g., the first testing terminal 21) is leveled with the top surface of the second testing pin 203 (e.g., the second testing terminal 23) so that there is no empty space between the first testing terminal 21 of the first testing pin 201 and the second testing terminal 23 of the second testing pin 203. This prevents the first testing terminal 21 of the first testing pin 201 or the second testing terminal 23 of the second testing pin 203 from being deformed by an external stress during the testing process due to the existence of an empty space between the two terminals. Such deformation may cause further electrical contacts between the first testing terminal 21 of the first testing pin 201 and the second testing terminal 23 of the second testing pin 203 and thus affect the testing precision.

The insulating layer 202 may have a single-layer or a multi-layer (≥2) structure.

The insulating layer 202 may be made of one or multiple insulating materials including SiO, SiN, SiON, SiCN, SiC, etc. The insulating layer 202 may also be made of resin materials such as epoxy, polyimide resin, polyethylene resin, benzocyclobutene resin, polybenzoxazole resin, etc.

In one embodiment, the width of a portion of the second testing pin 203 gradually decreases along a direction pointing from the far end to the second testing terminal 23.

Referring to FIG. 1, the width of a portion of the second testing pin 203 becomes smaller as moving closer to the second testing terminal 23. When multiple testing probes 20 are used for test, the distance between the testing terminals of neighboring testing probes 20 becomes larger.

In one embodiment, the testing probe 20 integrates the first testing pin 201 and the second testing pin 203 onto a single testing probe with the second testing pin 203 surrounding the first testing pin 201. With an insulating layer 202 separating the first testing pin 201 and the second testing pin 203, the testing probe 20 ensures a compacted size of the probe; in the meantime, it also improves the mechanical strength of the probe. Moreover, the first testing pin 201 and the second testing pin 203 form a coaxial structure, the distance between the first testing pin 201 and the second testing pin 203 is relatively precise and during testing, the distance between the first testing pin 201 and the second testing pin 203 does not change, thus precision of test is improved. In addition, compared to multiple testing pins (for example, double ejector pins or connecting fingers) required in the current technology for performing electrical property tests, a single testing probe of the present disclosure alone can be used to complete such tests on electrical properties because both the first testing pin 201 and the second testing pin 203 are integrated into a single testing probe 20.

When applying the testing probe 20 of the present disclosure for electrical property tests, the testing probe may be used for a resistance test or a high-current test. Specifically, the top part of the testing probe 20 is placed in contact with the terminal to be tested with the first testing terminal 21 of the first testing pin 201 and the second testing terminal 23 of the second testing pin 203 contacting the surface of the terminal to be tested. A test voltage is applied between the first testing pin 201 and the second testing pin 203. By measuring the current passing through the first testing pin 201, the second testing pin 203, and the terminal to be tested and then dividing the applied test voltage by the measured current, a test resistance is obtained.

Using the testing probe 20 of the present disclosure for resistance test, the first testing probe 201 and the second testing probe 203 are coaxial, thus the test current passes through the first testing probe 201 and evenly spreads around and flows to the second testing probe 203. That is, current flows uniformly along different directions in the annular region of the terminal to be tested (the part in contact with the insulating layer 202) between the first testing pin 201 and the second testing pin 203, thus increases the precision of test.

In certain other embodiments, the testing probe of the present disclosure may be used for testing other electrical properties. For example, multiple testing probes may be used for electrical property test. In such a case, the test current may flow from the first or the second testing pin of one testing probe to the first or the second testing pin of another testing probe; or the test current may flow from the first and the second testing pins of one testing probe to the first and the second testing pins of another testing probe.

Figure 3:
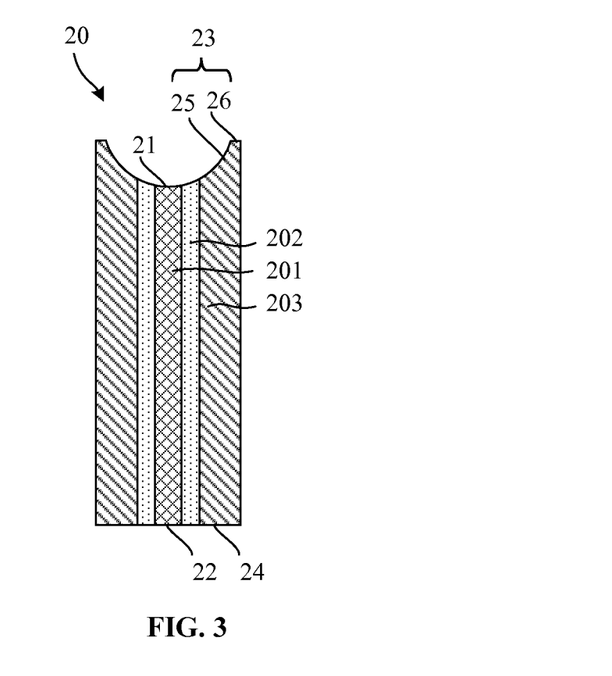
FIG. 3 illustrates a schematic cross-section view of another testing probe according to various disclosed embodiments of the present disclosure.

FIG. 3 shows a schematic cross-section view of another testing probe in another embodiment of the present disclosure.

Referring to FIG. 3, in the present embodiment, a testing probe 20 is provided and the testing probe 20 includes:

a first testing pin 201 including a first testing terminal 21 located on the top and a first connection terminal 22 located on the bottom;

an insulating layer 202 covering the side surface of the first testing pin 201; and a second testing pin 203, covering the surface of the insulating layer 202 and surrounding the first testing pin 201, including a second testing terminal 23 located on the top and a second connection terminal 24 located on the bottom.

The second testing pin 203 and the first testing pin 201 form a coaxial structure. The surface of the first testing terminal 21 of the first testing pin 201 and the top surface of the insulating layer 202 are lower than the surface of the second testing terminal 23 of the second testing pin 203. A second concave surface is formed on the surface of the first testing terminal 21 of the first testing pin 201 and the top surface of the insulating layer 203 and a first concave surface 25 is formed on the top of the second testing pin 23. One edge of the first concave surface 25 is in contact with the edge of the second concave surface (or an edge of the insulating layer 202) while the other edge of the first concave surface 25 is in contact with the top surface of the second testing pin 203.

Compared to that in the previous embodiment described above in FIGS. 1-2, in the present embodiment, the surface of the first testing terminal 21 of the first testing pin 201 and the top surface of the insulating layer 202 form the second concave surface. When performing electrical property tests, the surface of the first testing terminal 21 of the first testing pin 201 may form excellent surface contacts with terminals to be tested on sphere, ellipsoid, or spheroid, thus increase the contact area.

In the present embodiment, the interconnected the first concave surface 25 and the second concave surface coincide well with an arc surface of a terminal to be tested on a sphere, ellipsoid, or spheroid so that the testing probe 20 may form excellent surface contacts with terminals to be tested on sphere, ellipsoid, or spheroid, thus increase the precision of test.

In the present embodiment, other aspects of the testing probe are similar to that described in the previous embodiment illustrated in FIGS. 1-2.

Figure 4:
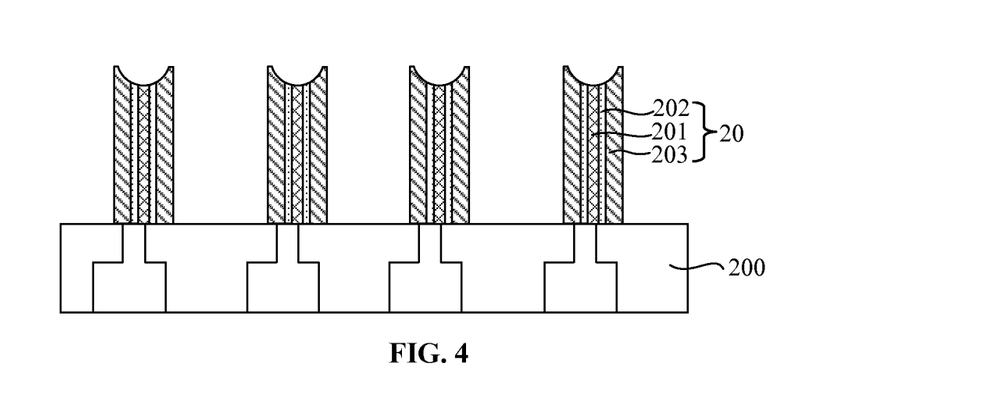
FIG. 4 illustrates a schematic cross-section view of a testing fixture according to various disclosed embodiments of the present disclosure.

The present disclosure also provides a testing fixture. FIG. 4 shows a schematic cross-section view of a testing fixture in one embodiment. Referring to FIG. 4, the testing fixture includes a substrate 200 and a number of testing probes 20 formed on the substrate 200.

The substrate 200 has signal transmission circuits formed inside. A signal transmission circuit includes a first input terminal, a first output terminal, a second input terminal, and a second output terminal. The first output terminal is electrically connected to a first testing pin 201 while the second output terminal is electrically connected to a second testing pin 203. The first output terminal and the second output terminal are also separately connected to an external testing circuit. The testing circuit is used to provide testing signals. The signal transmission circuit is used to transmit the testing signal generated in testing circuit to the first testing pin 201 and the second testing pin 203. The signal transmission circuit is also used to transmit electric signals obtained in the testing process to the testing circuit. The testing circuit processes the received electric signals and thus a testing parameter is obtained.

The substrate 200 is made of any appropriate materials such as PCB resin. The first input terminal and the first output terminal are electrically connected with each other through a first metal wire located inside of the substrate. The second input terminal and the second output are also electrically connected with each other through the second gold wire located inside of the substrate.

In one embodiment, the substrate 200 includes a front side and, as oppose to the front side, a back side. The back side of the substrate 200 includes interface areas. A number of first output terminals and second output terminals are located on the front surface of the substrate 200 and correspond to the first testing pins and the second testing pins, respectively. A number of first input terminals and second input terminals may be centralized in the interface areas on the back side of the substrate 200 so that the first input terminals and the second input terminals can be connected to external testing circuits through one of multiple interfaces. In one embodiment, the substrate 200 may be formed by pressing multiple layers of PCB resin boards together. Each layer of the PCB resin boards includes a number of interconnect structures and each interconnect structure includes a via hole interconnect structure running though the PCB resin board and a metal layer on the surface of the PCB resin board connecting with the via hole interconnect structure. When the multiple layers of the PCB resin boards are pressed, multiple interconnect structures electrically connected with each other to form first metal wires or second metal wires so that the number of the first input terminals and the second terminals can be centralized in the interface areas on the back side of the substrate 200.

In another embodiment, the substrate 200 includes a front side and, as oppose to the front side, a back side. The back side of the substrate 200 includes interface areas. A number of first output terminals and second output terminals are located on the front surface of the substrate 200 and a number of first input terminals and second input terminals are located on the back side of the substrate 200. First via hole interconnect structures and second via hole interconnect structures running through the substrate 200 may be formed in the substrate 200. The first input terminals and the first output terminals are electrically connected to each other through the first via hole interconnect structures. The second input terminals and the second output terminals are electrically connected to each other through the second via hole interconnect structures. The back side of the substrate 200 also has a number of first rewiring metal layers and second rewiring metal layers. One end of each first rewiring metal layer is electrically connected with a first input terminal and the other end of the first rewiring metal layer is located an interface area on the back side of the substrate 200. One end of each second rewiring metal layer is electrically connected with a second input terminal and the other end of the second rewiring metal layer is located an interface area on the back side of the substrate 200. In interface areas, the first rewiring metal layer and the second rewiring metal layer are electrically connected to external testing circuits through one or multiple interfaces.

In certain embodiments, testing circuits (not shown) may be formed in the substrate 200. The testing circuits include first signal terminals and second signal terminals. The first signal terminals are electrically connected to the first connection terminals 22 of the first testing pin 201 while the second signal terminals are electrically connected to the second connection terminals 24 of the second testing pin 203. Using the testing circuits to perform test, a testing signal (such as voltage signal and current signal) is applied to a first testing pin 201 and a second testing pin 203. An electrical signal (such as current signal) is then received. A testing parameter (such as resistance) is obtained by further analyzing the received electrical signal. In one embodiment, the substrate 200 includes a semiconductor substrate (such as Si substrate, and/or SiN substrate) and a dielectric layer located on a top surface of the substrate. Semiconductor components (such as transistors) are formed on the semiconductor substrate. Metal interconnect wires and passive components (such as resistors and capacitors) are formed in the dielectric layer. The semiconductor components and the passive components are connected together by the metal interconnect wires and form testing circuits. The first signal terminals and the second signal terminals may be lead out through the first metal wires and the second metal wires that are connected to the testing circuits in the dielectric layer.

Figure 5:
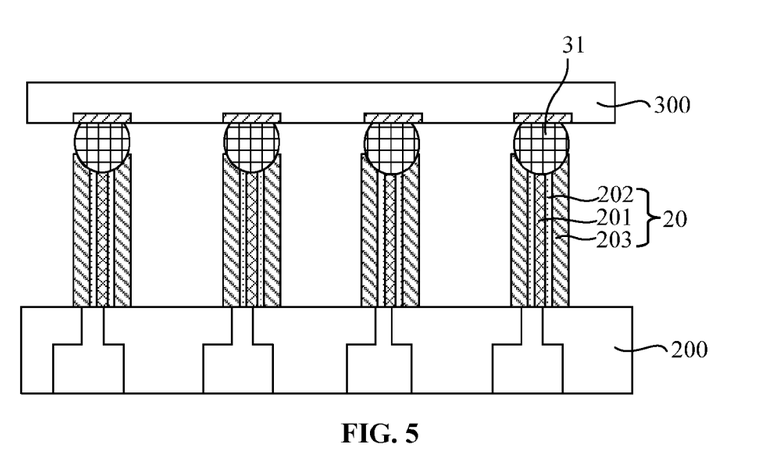
FIG. 5 illustrates a schematic cross-section view of an exemplary testing setup during an electrical property test using a testing fixture according to various disclosed embodiments of the present disclosure.

FIG. 5 shows a schematic cross-section view of an exemplary testing setup during an electrical property test using a testing fixture of the present disclosure.

Referring to FIG. 5, at beginning of the test, a semiconductor testing fixture is placed into a testing base station. A packaged structure 300 to be tested is then placed on the semiconductor testing fixture. The packaged structure 300 has a number of terminals to be tested 31. In one embodiment, the terminal to be tested 31 is a soldering ball. A portion of the surface of the terminal to be tested 31 and the testing terminal of the corresponding testing probe 20 are electrically connected; and a testing signal is then applied to the first testing pin 201 and the second testing pin 203 to perform the electrical property test.

By using the semiconductor testing fixture of the present disclosure, electrical property tests on multiple terminals to be tested on the packaged structure 300 may be simultaneously performed, thus the efficiency and the precision of test are improved.

The semiconductor testing fixture of the present disclosure may be used for manual test (manually load packaged structures to be tested) or for automatic test (automatically load packaged structures to be tested by robot).

Figure 18:
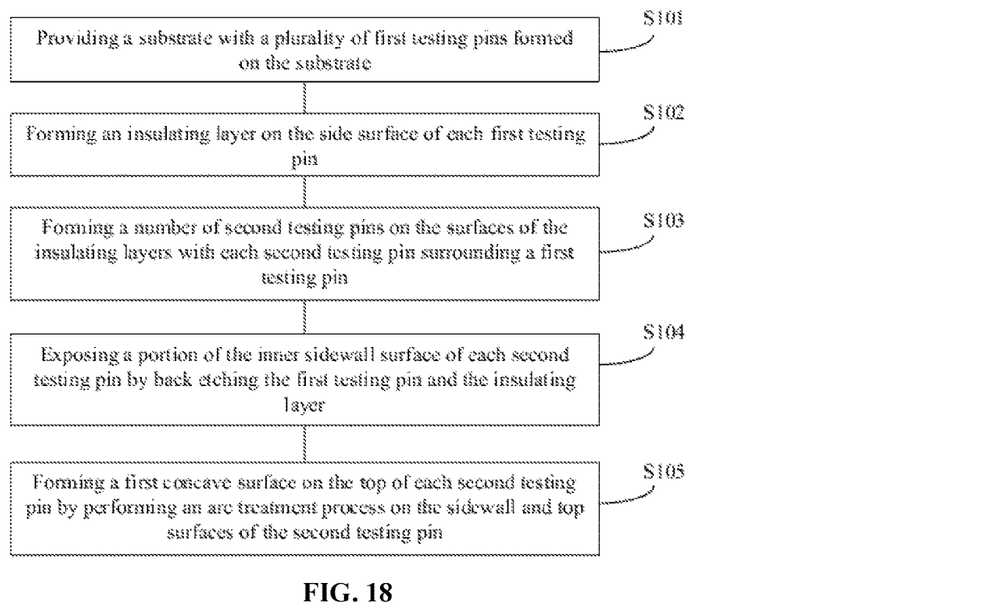
FIG. 18 illustrates an exemplary fabrication process of a testing fixture according to various disclosed embodiments of the present disclosure.
Figure 19:
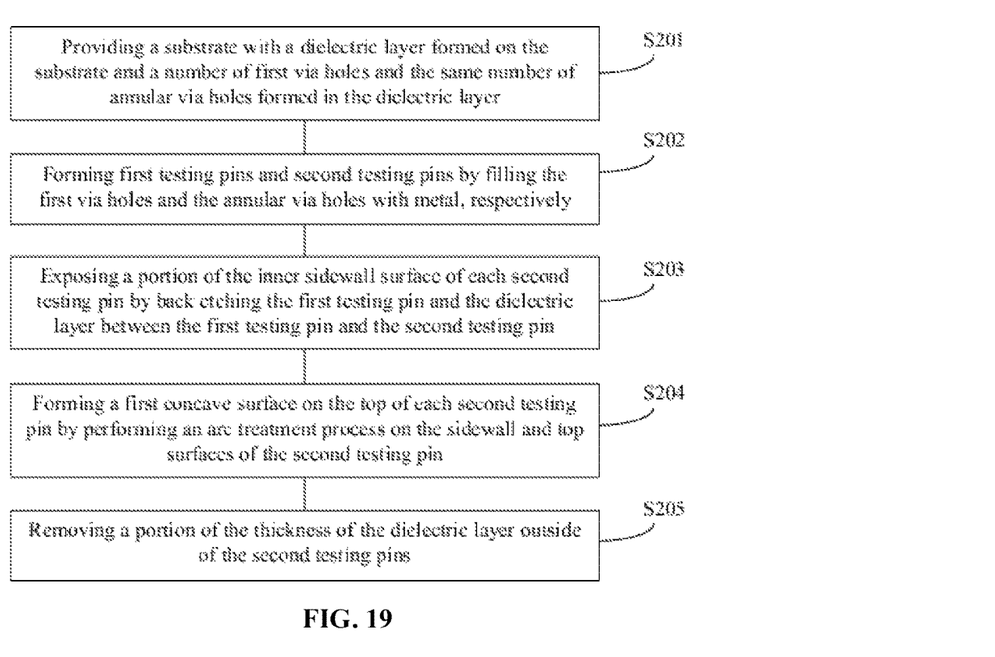
FIG. 19 illustrates another exemplary fabrication process of a testing fixture according to various disclosed embodiments of the present disclosure.

The present disclosure also provides a method for forming the semiconductor testing fixture described above. FIG. 18 illustrates an exemplary fabrication process of a testing fixture consistent with the disclosed embodiments. FIGS. 6-12 illustrate schematic cross-section views of semiconductor structures corresponding to certain stages of an exemplary fabrication process of a testing fixture consistent with the disclosed embodiments.

Figure 6:
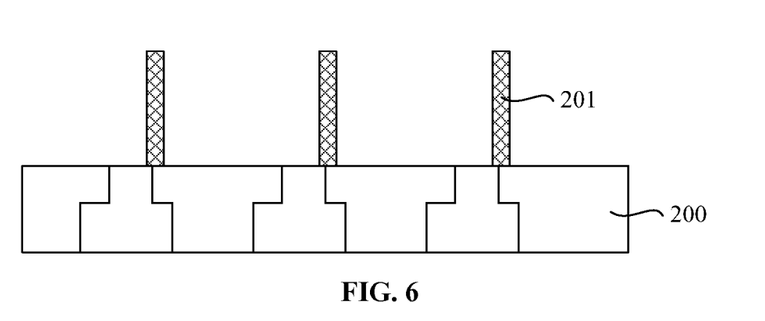
FIGS. 6-12 illustrate schematic cross-section views of semiconductor structures corresponding to certain stages of an exemplary fabrication process of a testing fixture according to various disclosed embodiments of the present disclosure.

Referring to FIG. 6, at beginning of the process, a substrate 200 is provided and a number of first testing pins 201 are formed on the substrate 200 (S101). Signal transmission circuits are formed in the substrate 200. A signal transmission circuit includes a first input terminal, a first output terminal, a second input terminal, and a second output terminal. The first output terminal is electrically connected to a first testing pin 201 while the second output terminal is electrically connected to a second testing pin 203. The first output terminal and the second output terminal are also electrically connected to an external testing circuit, respectively. The testing circuit is used to provide testing signals. The signal transmission circuit is used to transmit the testing signal generated in testing circuit to the first testing pin 201 and the second testing pin 203. The signal transmission circuit is also used to transmit electric signals obtained in the testing process to the testing circuit. The testing circuit processes the received electric signals and thus a testing parameter is obtained.

The substrate 200 is made of any appropriate materials such as PCB resin. The first input terminal and the first output terminal are electrically connected with each other through a first metal wire located inside of the substrate. The second input terminal and the second output are also electrically connected with each other through the second gold wire located inside of the substrate.

In one embodiment, the substrate 200 includes a front side and, as oppose to the front side, a back side. The back side of the substrate 200 includes interface areas. A number of first output terminals and second output terminals are located on the front surface of the substrate 200 and correspond to the first testing pins and the second testing pins, respectively. A number of first input terminals and second input terminals may be centralized in the interface areas on the back side of the substrate 200 so that the first input terminals and the second input terminals can be connected to external testing circuits through one of multiple interfaces.

In one embodiment, the substrate 200 may be formed by pressing multiple layers of PCB resin boards together. Each layer of the PCB resin boards includes a number of interconnect structures and each interconnect structure includes a via hole interconnect structure running though the PCB resin board and a metal layer on the surface of the PCB resin board connecting with the via hole interconnect structure. When the multiple layers of the PCB resin boards are pressed, multiple interconnect structures electrically connected with each other to form first metal wires or second metal wires so that the number of the first input terminals and the second terminals can be centralized in the interface areas on the back side of the substrate 200.

In another embodiment, the substrate 200 includes a front side and, as oppose to the front side, a back side. The back side of the substrate 200 includes interface areas. A number of first output terminals and second output terminals are located on the front surface of the substrate 200 and a number of first input terminals and second input terminals are located on the back side of the substrate 200. First via hole interconnect structures and second via hole interconnect structures running through the substrate 200 may be formed in the substrate 200. The first input terminals and the first output terminals are electrically connected to each other through the first via hole interconnect structures. The second input terminals and the second output terminals are electrically connected to each other through the second via hole interconnect structures. The back side of the substrate 200 also has a number of first rewiring metal layers and second rewiring metal layers. One end of each first rewiring metal layer is electrically connected with a first input terminal and the other end of the first rewiring metal layer is located an interface area on the back side of the substrate 200. One end of each second rewiring metal layer is electrically connected with a second input terminal and the other end of the second rewiring metal layer is located an interface area on the back side of the substrate 200. In interface areas, the first rewiring metal layer and the second rewiring metal layer are electrically connected to external testing circuits through one or multiple interfaces.

In other embodiments, testing circuits (not shown) may be formed in the substrate 200. The testing circuits include first signal terminals and second signal terminals. The first signal terminals are electrically connected to the first connection terminals 22 of the first testing pin 201 while the second signal terminals are electrically connected to the second connection terminals 24 of the second testing pin 203. Using the testing circuits to perform test, a testing signal (such as voltage signal and current signal) is applied to a first testing pin 201 and a second testing pin 203. An electrical signal (such as current signal) is then received. A testing parameter (such as resistance) is obtained by further analyzing the received electrical signal.

The first testing pin 201 has a cylindrical shape. The cross-section of the first testing pin 201 along a direction parallel to the surface of the substrate 200 has a round shape. The diameter of the first testing pin 201 is in a range of 500 nm-500 µm. The number of the first testing pins 201 formed on the top of the substrate 200 is greater than 2. In one embodiment, the number of the first testing pins 201 formed on the top of the substrate 200 is 3.

In other embodiments, the cross-section of the first testing pin may have a different shape. For example, the cross-section of the first testing pin can be a polygon such as triangle or square.

In one embodiment, the formation process for the first testing pin 201 includes: forming a first metal layer (not shown) on the top of the substrate 200; forming a patterned mask layer on the top of the first metal layer; forming a number of first testing pins 201 by etching the first metal layer using the patterned mask layer as a mask; and removing the patterned mask layer.

In another embodiment, the formation process for the first testing pin 201 includes: forming a sacrificial layer (not shown) on the top of the substrate 200; forming a number of via holes in the sacrificial layer to exposed the substrate 200; filling the via holes with a first metal layer to form a number of first testing pins; and removing the sacrificial layer.

The via holes are filled with the first metal layer using an electroplating process. Prior to the filling of the via holes with the first metal layer, the process also includes forming a conductive layer on the side surface and the bottom surface of the via holes as well as the surface of the sacrificial layer. The conductive layer is then used as a cathode for the subsequent electroplating process.

The conductive layer is made of one or multiple of Ti, Ta, TiN, TaN, etc. The conductive layer may have a single-layer or a multi-layer structure.

In one embodiment, the conductive layer has a double-layer structure. The conductive layer with the double-layer structure includes a Ti layer and a TiN layer on the top of the Ti layer, or a Ta layer and a TaN layer on the top of the Ta layer.

The thickness of the conductive layer is smaller than the diameter of the via hole. In one embodiment, the thickness of the conductive layer is 50 nm-200 nm. The conductive layer is formed by using a sputtering process.

After the formation of the conductive layer, the electroplating process is performed to form the first metal layer. The first metal layer is located on the conductive layer and fills all the via holes. After the electroplating process, the fabrication method further includes: removing the first metal layer and the conductive layer on the surface of the sacrificial layer by using a chemical mechanical polishing (CMP) process to form the first testing pins 201. The first testing pins 201 include a first metal layer and a barrier layer surrounding the first metal layer to prevent diffusion. The barrier layer used to prevent diffusion is formed from the remained conductive layer after the CMP process, and is used to prevent the metal atoms in the metal layer from diffusing into a subsequently-formed insulating layer.

The first metal layer is made of Cu, Au, W, alloy, or any other appropriate metallic material.

The surface of the first testing pin 201 contacting with the surface of the substrate 200 is the first connection terminal. The surface of the first testing pin 201 opposite to the first connection terminal is the first testing terminal.

Figure 7:
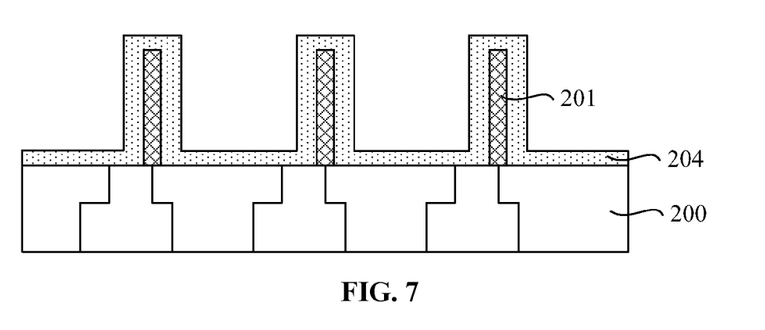
Figure 8:
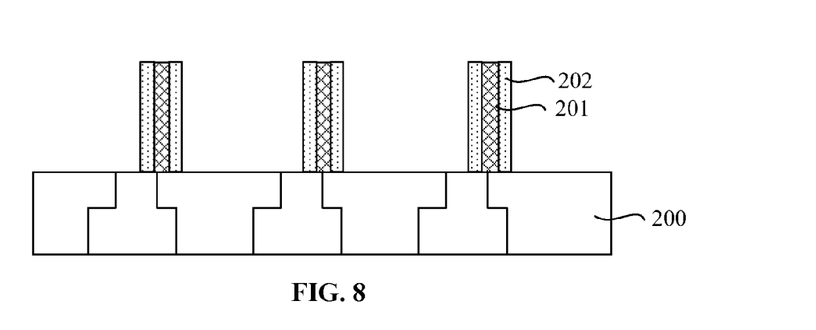

After the formation of the first testing pins 201, an insulating layer 202 is formed on the side surface of each first testing pin 201 (S102).

Referring to FIG. 7 and FIG. 8, an insulating layer 202 is formed on the sidewall of each first testing pin 201.

The fabrication process of the insulating layer 202 includes: forming an insulating film layer 204 to cover the substrate 200 and the top and the side surfaces of the first testing pins 201; and forming an insulating layer 202 on the side surface of the first testing pin 201 by etching the insulating film layer 204 without using any mask.

The thickness of the insulating layer 202 is in a range of 80 nm-400 µm. The insulating layer 202 may be made of one or multiple of appropriate insulating materials such as SiO, SiN, SiON, SiCN, SiC, etc.

The insulating layer 202 may have a single-layer or a multi-layer (≥2) structure.

An anisotropic plasma etching process is used for the maskless etching of the insulating layer 202. In one embodiment, the plasma etching process uses an etching gas containing fluorine and carbon. Specifically, the etching gas may be one or multiple of $CF_4$, $C_2F_6$, $C_4F_8$, $CHF_3$, $CH_2F_2$, etc. The source power is in a range of 500-1000 W, the bias power is in a range of 0-100 W, the pressure of the etching chamber is in a range of 2-500 mTorr.

In one embodiment, the insulating layer 202 is a single-layer SiO.

In other embodiments, the insulating layer 202 may also be made of epoxy, polyimide resin, polyethylene resin, benzocyclobutene resin, polybenzoxazole resin, etc.

The insulating layer 202 is formed by using a stencil printing process.

Figure 9:
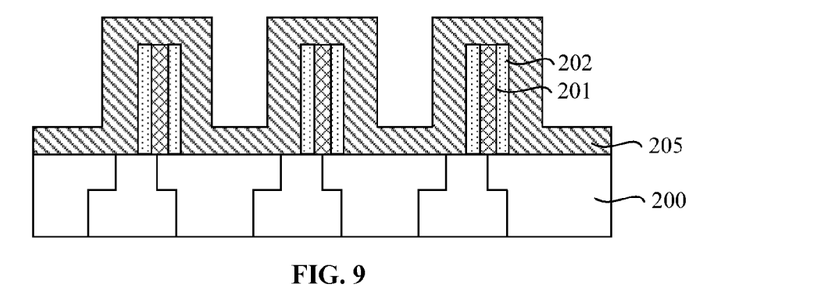
Figure 10:
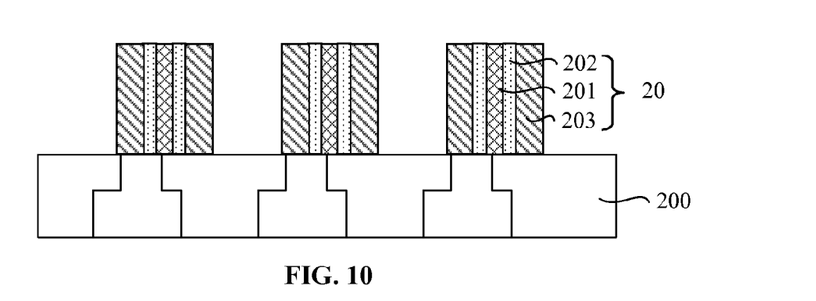

Further, corresponding to each first testing pin 201, a second testing 203 is formed on the surface of the insulating layer to surround the first testing pin 201 (S103).

Referring to FIG. 9 and FIG. 10, a number of second testing pins 203 are formed on the surfaces of the insulating layers 202. Each second testing pin 203 surrounds a corresponding first testing pin 201.

The fabrication process of the second testing pin 203 is: forming a second metal layer 205 to cover the insulating layer 202 and the top surface of the first testing pin 201; and forming a second testing pin 203 on the insulating layer 202 by etching the second metal layer 205 without using any mask.

The second metal layer 205 is formed by sputtering. The second metal layer 205 is made of Cu, Au, W, alloy, or any other appropriate metallic material. The thickness of the second metal layer is in a range of 60 nm-300 µm.

An anisotropic plasma etching process is used for the maskless etching of the second metal layer 205. In one embodiment, the etching gas used in the plasma etching process may be one or multiple of $CF_4$, $C_2F_6$, $C_4F_8$, $CHF_3$, $CH_2F_2$, etc. The source power is in a range of 500-1000 W, the bias power is in a range of 0-100 W, the pressure of the etching chamber is in a range of 10-500 mTorr.

Figure 11:
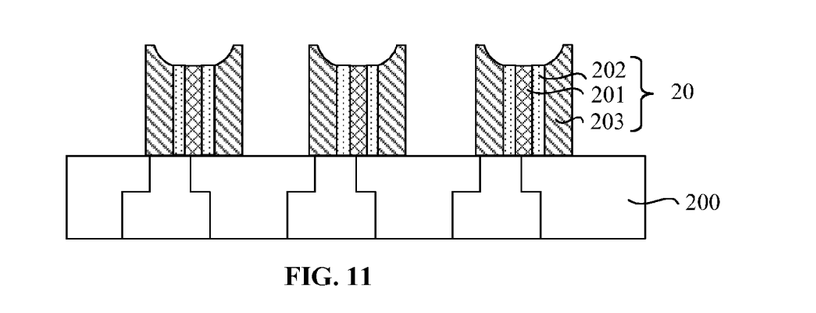

After the formation of the second testing pins 203, a portion of the inner sidewall surface of each second testing pin 203 is exposed by a back etching process performed on the first testing pin 201 and the insulating layer 202 (S104).

Referring to FIG. 11, the first testing pin 201 and the insulating layer 202 are then etched back to let the top surfaces of the first testing pin 201 and the insulating layer 202 become lower than the top surface of the second testing pin 203 so that a portion of the inner sidewall surface of the second testing pin 203 is exposed.

In one embodiment, after back etching, the surface of the first testing pin 201 and the top surface of the insulating layer 203 are both flat. The back etching of the first testing pin 201 and the insulating layer 202 uses anisotropic dry etching, such as plasma etching. The etching gas of the plasma etching may be HBr, $Cl_2$, $CF_4$.

Further, an arc treatment process is performed on the inner sidewall surface and the top surface of the second testing pin 203 to form a first concave surface 25 (S105).

After back etching the first testing pin 201 and the insulating layer 202, a portion of the inner sidewall surface of the second testing pin 203 is exposed, facilitating subsequent arc treatment process.

Referring to FIG. 11, after the arc treatment process, one edge of the first concave surface 25 is in contact with an edge of the insulating layer 202 while the other edge of the first concave surface 25 is in contact with the top surface of the second testing pin 203.

A plasma etching process or a laser etching process may be adopted for the arc treatment.

In one embodiment, arc treatment uses a plasma etching process. The etching gas of the plasma etching process may be HBr, $Cl_2$, $CF_4$, the source power is in a range of 800-2000 W, the bias power is in a range of 200-800 W, the pressure of the etching chamber is in a range of 5-50 mTorr. During the plasma etching process, the etching plasma may bombard the exposed sidewall surface and a portion of the top surface of the second testing pin 203 from a certain angle to form the first concave surface 25. Prior to the plasma etching process, a mask layer may be formed on the substrate 200 and a portion of the top surface of the second testing pin 203.

In another embodiment, arc treatment uses a laser etching process. During the laser etching process, the etching time and the laser power may be adjusted to form the first concave surface. The etching may be scanned along a direction from the outer sidewall to the inner sidewall of the second testing pin 203, or along a direction from the inner sidewall to the outer sidewall of the second testing pin 203. In one embodiment, laser is scanned along a direction from the outer sidewall to the inner sidewall of the second testing pin 203 and the energy of the laser beam remains unchanged during the scan. The energy of the laser beam may be in a range of $1E18$ $W/cm^2$–$2E20$ $W/cm^2$. The scanning time of the laser beam increases in an arc manner during the laser beam scanning from the inner sidewall to the outer sidewall of the second testing pin 203. As such, the first concave surface is formed on the top surface of the second testing pin 203. One edge of the first concave surface is in contact with an edge of the insulating layer 202 while the other edge of the first concave surface is in contact with the top of the second testing pin 203. That is, the first concave surface extends obliquely up from the edge of the insulating layer 202 to the top surface of the second testing pin 203. In another embodiment, the etching time keeps constant for all etching steps as laser beam scanning from the outer sidewall to the inner sidewall of the second testing pin 203 while the energy of the laser beam increases in an arc manner during the scan. As such, the first concave surface is formed on the top of the second testing pin 203.

Figure 12:
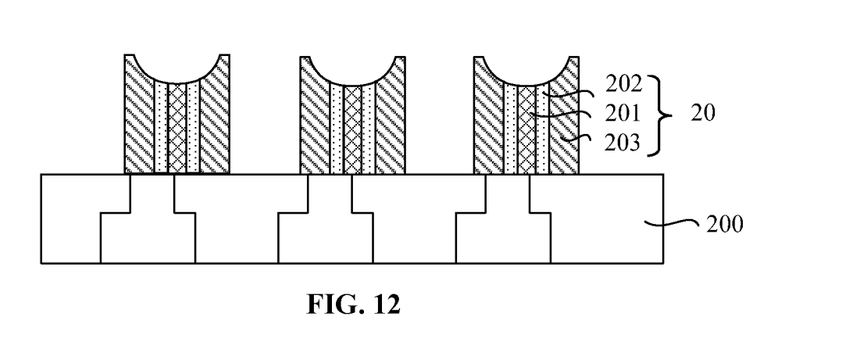

In certain other embodiments, referring to FIG. 12, after forming the first testing pin 201, the insulating layer 202, and the second testing pin 203 (referring to FIG. 10), an arc treatment process is performed on the top surface of the first testing pin 201, the top surface of the insulating layer 202, and the top surface of the second testing pin 203. A first concave surface 25 is then formed on the top of the second testing pin 203 and a second concave surface is formed on the top of the first testing pin 201 and the top of the insulating layer 202. One edge of the first concave surface is in contact with the edge of the second concave surface and the other edge of the first concave surface is in contact with the top surface of the second testing pin 203.

A plasma etching process or a laser etching process may be adopted for the arc treatment.

In one embodiment, arc treatment uses a plasma etching process. Prior to the plasma etching process, a mask layer may be formed to cover the substrate 200 and a portion of the top surface of the second testing pin 203. The mask layer has an opening exposing the top surface of the first testing pin 201, the top surface of the insulating layer 202, and a portion of the top surface of the second testing pin 203. The etching gas of the plasma etching process may be HBr, $Cl_2$, $CF_4$, the source power is in a range of 800-2000 W, the bias power is in a range of −150 W, the pressure of the etching chamber is in a range of 100 mTorr-1 Torr. During the plasma etching process, the pressure in the etching chamber is kept strong so that etching byproducts may not escape timely through the opening and the notch formed on the bottom of the opening by etching. Therefore, during the etching process, etching byproducts may accumulate on the sidewall of the opening and the notch. As etching time continues, the etching rate on materials near the edge of the bottom surface of the notch gradually decreases. That is, the etching speed on materials near the edge of the bottom surface of the notch may be lower than the etching speed on materials near the center of the bottom surface of the notch. After the completion of the etching process, a cleaning process (for example, acid cleaning) is adopted to remove the etching byproducts generated during the etching process to form the first concave surface on the top of the second testing pin 203 and the second concave surface on the top of the first testing pin 201 and the top of the insulating layer 202.

In another embodiment, arc treatment uses a laser etching process. During the laser etching process, the etching time and the laser power may be adjusted to form the first concave surface and the second concave surface. The etching may be scanned along a direction from the outer sidewall of the second testing pin 203 to the center of the first testing pin 201, or along a direction from the center of the first testing pin 201 to the outer sidewall of the second testing pin 203. In one embodiment, laser is scanned along a direction from the outer sidewall of the second testing pin 203 to the center of the first testing pin 201 and the energy of the laser beam remains unchanged during the scan. The energy of the laser beam may be in a range of $1E18$ $W/cm^2$–$2E20$ $W/cm^2$. The scanning time of the laser beam increases in an arc manner during the laser beam scanning from the center of the first testing pin 201 to the outer sidewall of the second testing pin 203. As such, the first concave surface is formed on the top of the second testing pin 203 and the second concave surface is formed on the top of the first testing pin 201 and the top of the insulating layer 202. One edge of the first concave surface is in contact with the edge of the second concave surface while the other edge of the first concave surface is in contact with the top surface of the second testing pin 203. That is, the first concave surface extends obliquely up from the edge of the insulating layer 202 to the top surface of the second testing pin 203. In another embodiment, the etching time keeps constant for all etching steps as laser beam scanning from the outer sidewall of the second testing pin 203 to the center of the first testing pin 201 while the energy of the laser beam increases in an arc manner during the scan. As such, the first concave surface is formed on the top of the second testing pin 203 and the second concave surface is formed on the top of the first testing pin 201 and the top of the insulating layer 202.

The present disclosure provides another method for forming the semiconductor testing fixture described above. FIGS. 13-17 illustrate schematic cross-section views of semiconductor structures corresponding to certain stages of the embodiment.

Figure 13:
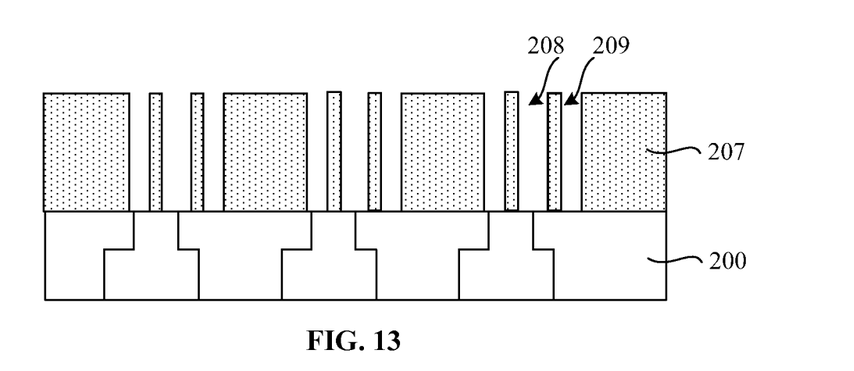
FIGS. 13-17 illustrate schematic cross-section views of semiconductor structures corresponding to certain stages of another exemplary fabrication process of a testing fixture according to various disclosed embodiments of the present disclosure.

Referring to FIG. 13, at beginning of the fabrication process, a substrate 200 is provided with a dielectric layer 207 formed on a top surface of the substrate 200 (S201). A number of first via holes 208 and the same number of annular via holes 209 are formed in the dielectric layer 207 with each first via hole 208 surrounded by an annular via hole 209. Each first via hole 208 is separated from the corresponding annular via hole 209 by a portion of the dielectric layer.

The first via holes 208 and the annular via holes 209 expose the surface of the substrate 200. Subsequently, the first via holes are filled with metal and form the first testing pin while the annular via holes are filled with metal and form the second testing pin.

Signal transmission circuits or testing circuits are formed in the substrate 200. Description on signal transmission circuits and testing circuits are provided in a previous section.

Figure 14:
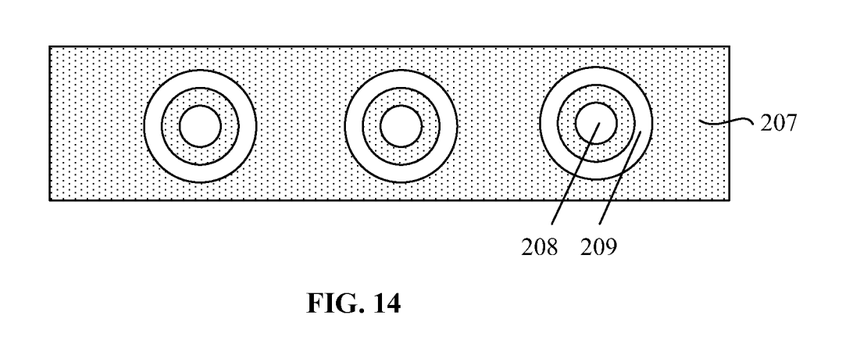

FIG. 14 shows a schematic top view of the structure shown in FIG. 13. Referring to FIG. 14, the first via holes 208 are circles, the annular via holes 209 are rings surrounding corresponding first via holes. Each first via hole 208 is separated from the corresponding annular via hole 209 by a portion of the dielectric layer.

In other embodiments, the cross-section of the first via hole may have a different shape. For example, the cross-section of the first via hole can be a polygon, such as triangle, square, etc.

In one embodiment, the dielectric layer 207 is made of one or multiple insulating materials including SiO, SiN, SiON, SiCN, SiC, etc. The dielectric layer 207 is formed on the substrate 200 by using a chemical vapor deposition method. A patterned photoresist layer is then formed on the top of the dielectric layer 207. A number of first via holes 208 and the same number of annular via holes 209 are formed in the dielectric layer 207 by etching the dielectric layer 207 using the patterned photoresist layer as a mask. Each first via hole 208 is surrounded by a annular via hole 209. After the formation of the first via holes and the annular via holes, the patterned photoresist layer is then removed.

In another embodiment, the dielectric layer 207 may be made of resin adhesive. The resin adhesive may be epoxy adhesive, polyimide resin adhesive, polyethylene resin adhesive, benzocyclobutene resin adhesive, polybenzoxazole resin adhesive, etc. The dielectric layer 207 is formed on the substrate 200 by using a fabrication process such as dry film process, wet film process, printing process, and rolling process. A number of first via holes 208 and the same number of annular via holes 209 with each of the first via hole 208 surrounded by an annular via hole 209 are then formed in the dielectric layer through exposure and develop process. As such, the formation process simplifies the fabrication procedures.

Figure 15:
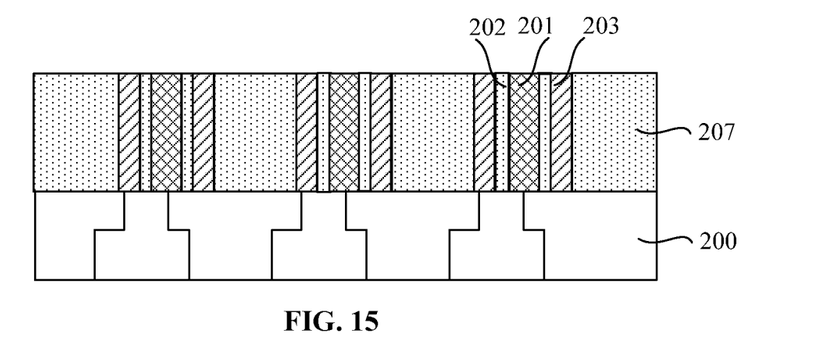

Further, a number of first testing pins 201 and the same number of the second testing pins 203 are formed by filling the first via holes 208 and the annular via holes 209, respectively, with metal (S202).

Referring to FIG. 15, the first via holes 208 (referring to FIG. 13) are filled with metal and form the first testing pins 201 while the annular via holes 209 (referring to FIG. 13) are filled with metal and form the second testing pins 203.

The first testing pins 201 and the second testing pins 203 are formed by using a same fabrication process.

The process to fill the first via holes 208 and the annular via holes 209 with metal is an electroplating process. Prior to filling metal into the first via holes 208 and the annular via holes 209, the fabrication process also includes forming a conductive layer on the sidewalls and bottom surfaces of the first via holes 208 and the annular via holes 209. The conductive layer is used as a cathode during the electroplating process.

The conductive layer may be made of one or multiple of Ti, Ta, TiN, TaN, etc. The conductive layer may have a single-layer or a multi-layer structure.

In one embodiment, the conductive layer has a double-layer structure. The conductive layer with the double-layer structure includes a Ti layer and a TiN layer on the top of the Ti layer, or a Ta layer and a TaN layer on the top of the Ta layer.

The thickness of the conductive layer is below the smaller value of the diameter of the first via hole 208 and the thickness of the annular via hole. The conductive layer is formed by using a sputtering process.

After the formation of the conductive layer, the electroplating process is performed to form a metal layer. The metal layer is located on the top of the conductive layer and fills the first via holes 208 and the annular via holes 209. After electroplating, the fabrication process further includes forming the first testing pins 201 and the second testing pins 203 by removing the metal layer and the conductive layer on the surface of the dielectric layer 207 through a CMP process. Both first testing pins 201 and second testing pins 203 include a metal layer and a barrier layer surrounding the metal layer to prevent diffusion. The barrier layer used to prevent diffusion is formed from the remained conductive layer after the CMP process, and is used to prevent the metal atoms in the metal layer from diffusing into a subsequently-formed insulating layer.

The metal layer is made of Cu, Au, W, alloy, or any other appropriate metallic material.

In one embodiment, the first testing pins 201 and the second testing pins 203 are formed simultaneously during the electroplating process. Damage to the first testing pins 201 or the second testing pins 203 may be avoided during the etching process, leading to excellent surface morphology of the first testing pins 201 and the second testing pins 203.

The dielectric layer between the first testing pins 201 and the second testing pins 203 is used as an insulating layer 202.

Figure 16:
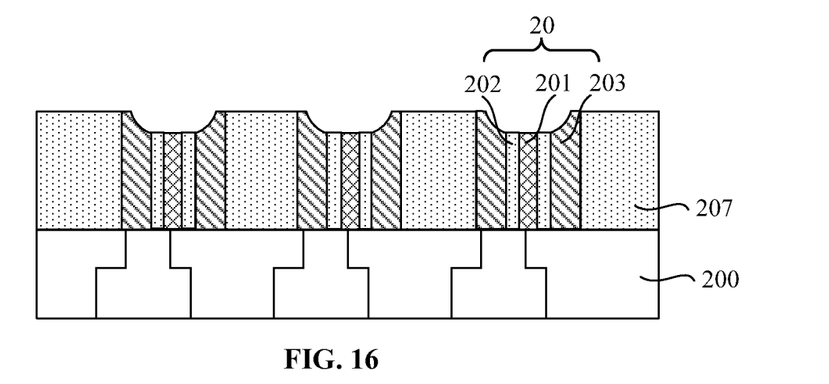

Further, a portion of the inner sidewall surface of each second testing pin 203 is exposed by a back etching process performed on the first testing pin 201 and the insulating layer 202 (S203).

Referring to FIG. 16, the first testing pin 201 and the insulating layer 202 are etched back to let the top surfaces of the first testing pin 201 and the insulating layer 202 become lower than the top surface of the second testing pin 203 so that a portion of the inner sidewall surface of the second testing pin 203 is exposed.

In one embodiment, after the back etching process, the surface of the first testing pin 201 and the insulating layer 202 is flat.

Further, an arc treatment process is performed on the inner sidewall surface and the top surface of the second testing pin 203 to form a first concave surface 25 (S204). Referring to FIG. 16, one edge of the first concave surface 25 is in contact with an edge of the insulating layer 202 while the other edge of the first concave surface 25 is in contact with the top surface of the second testing pin 203.

In certain other embodiments, after forming the first testing pin 201, the insulating layer 202, and the second testing pin 203 (referring to FIG. 15), an arc treatment process is performed on the top surface of the first testing pin 201, the top surface of the insulating layer 202, and the top surface of the second testing pin 203 to form a first concave surface on the top of the second testing pin 203 and a second concave surface on the top of the first testing pin 201 and the top of the insulating layer 202. One edge of the first concave surface is in contact with the edge of the second concave surface while the other edge of the first concave surface is in contact with the top surface of the second testing pin 203. The description and definition of the back etching process and the arc treatment process are stated in the embodiments provided in a previous section.

Figure 17:
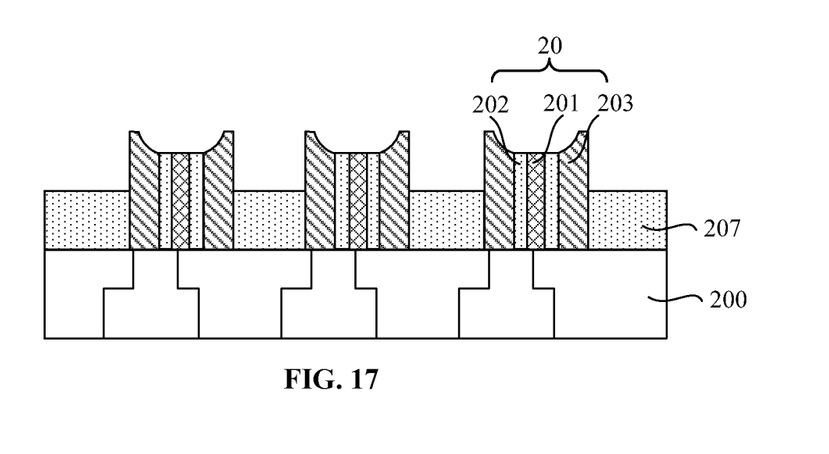

Finally, a portion of the thickness of the dielectric layer outside of the second testing pins is removed to expose a portion of the side surface of the second testing pins (S205). Referring to FIG. 17, a portion of the thickness of the dielectric layer 207 (referring to FIG. 12) outside of the second testing pins 203 is removed to expose a portion of the second testing pins 203.

Prior to removing the dielectric layer 207 outside of the second testing pins 203, a photoresist mask layer is formed on the first testing pins 201, the second testing pins 203, and the dielectric layer between the first testing pins 201 and the second testing pins 203; and a portion of the thickness of the dielectric layer 207 outside of the second testing pins 203 is then be removed by an etching process using the photoresist layer as a mask.

The portion of the thickness of the dielectric layer 207 outside of the second testing pins 203 is removed by a wet etching process or a dry etching process.

The reason to remove a portion of the thickness of the dielectric layer 207 is to protect the dielectric layer from contacting with the terminal to be tested during electrical property tests. The remained dielectric layer 207 may be used as a reinforcement layer to improve the mechanical strength between the testing probe and the substrate.

Present disclosure also provides a method for forming a testing probe described above. The method includes:

providing a substrate;

forming a number of first testing pins on the substrate with each first testing pin includes a first testing terminal on the top and a first connection terminal on the bottom;

forming an insulating layer on the sidewall of the first testing pins; and forming a number of second testing pins on the surface of the insulating layer with each second testing pin surrounding a first testing pin, each second testing pin including a second testing terminal on the top and a second connection terminal on the bottom, and each second testing terminal on the top of the second testing pin having a first concave surface.

The surface of the first testing terminal and the top surface of the insulating layer are lower than the surface of the second testing terminal.

In one embodiment, the surface of the first testing terminal of the first testing pin and the top surface of the insulating layer are flat and leveled with each other. One edge of the first concave surface is in contact with an edge of the insulating layer while the other edge of the first concave surface is in contact with the top surface of the second testing pin.

In one embodiment, the formation process for the first testing pin, the insulating layer, and the second testing pin includes: forming a number of the first testing pins on the substrate; forming an insulating film layer to cover the sidewall surface and the top surface of the first testing pins; forming the insulating layer on the sidewall surface of the first testing pins by etching the insulating film layer without using a mask; forming a second metal layer to cover the insulating layer and the top surface of the first testing pins; forming a number of the second testing pins on the surface of the insulating layer by etching the second metal layer without using a mask; back etching the first testing layer and the insulating layer to let the top surface of the first testing pin and the insulating layer be lower than the top surface of the second testing pin and also let a portion of the inner sidewall surface of the second testing pin be exposed; and forming a first concave surface on the top of the second testing pin by performing an arc treatment process on the exposed inner sidewall and top surfaces of the second testing pin.

In another embodiment, the surface of the first testing terminal and the top surface of the insulating layer have a second concave surface. One edge of the first concave surface is in contact with the edge of the second concave surface while the other edge of the first concave surface is in contact with the top surface of the second testing pin.

In certain other embodiments, the formation process for the first testing pin, the insulating layer, and the second testing pin includes: forming a dielectric layer on the substrate with a number of first via holes surrounded by the same number of first annular via holes, respectively in the dielectric layer and each first annular hole separated from the corresponding first via hole by a portion of the dielectric layer; forming first testing pins by filling the first via holes with metal and forming second testing pins by filling the annular via holes with metal; removing the dielectric layer outside of the second testing pins and using the dielectric layer between the first testing pins and the second testing pins as insulating layers; and performing an arc treatment process on the top surface of the first testing pins, the top surface of the insulating layers, and the top surface of the second testing pins to form first concave surfaces on the top of the second testing pins and second concave surfaces on the top of the first testing pins and the top of the insulating layers.

The arc treatment process is laser etching or plasma etching as described herein.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A testing probe, comprising:
   a first testing pin including a first testing terminal on a top thereof and a first connection terminal on a bottom thereof;
   an insulating layer covering an entire sidewall surface of the first testing pin; and
   a second testing pin on a surface of the insulating layer and including a second testing terminal on a top of the second testing pin and a second connection terminal on a bottom of the second testing pin, wherein a first concave surface is formed on a top of the second testing pin, and surrounds the first testing pin;
   wherein a top surface of the first testing terminal of the first testing pin, a top surface of the insulating layer, and a top surface of the second testing terminal of the second testing pin together form a surface of a near sphere, an ellipsoid, or a spheroid.

2. The testing probe according to claim 1, wherein a top surface of the first testing pin and a top surface of the insulating layer are lower than a surface of the second testing terminal of the second testing pin.

3. The testing probe according to claim 2, wherein:
a diameter of the first testing pin is in a range of 500 nm-500 µm;
a width of the insulating layer is in a range of 80 nm-400 µm; and
a width of the second testing pin is in a range of 60 nm-300 µm.

4. The testing probe according to claim 2, wherein the insulating layer is made of SiO, SiN, SiON, SiCN, SiC, or a resin.

5. The testing probe according to claim 1, wherein the first testing pin has a cylindrical shape.

6. A semiconductor testing fixture, comprising a substrate and a plurality of testing probes, each of the plurality of testing probes comprising:
a first testing pin including a first testing terminal on a top thereof and a first connection terminal on a bottom thereof;
an insulating layer covering an entire sidewall surface of the first testing pin; and
a second testing pin on a surface of the insulating layer and including a second testing terminal on a top of the second testing pin and a second connection terminal on a bottom of the second testing pin, wherein a first concave surface is formed on a top of the second testing pin, and surrounds the first testing pin;
wherein a top surface of the first testing terminal of the first testing pin, a top surface of the insulating layer, and a top surface of the second testing terminal of the second testing pin together form a surface of a near sphere, an ellipsoid, or a spheroid.

7. The semiconductor testing fixture according to claim 6, wherein:
the substrate has signal transmission circuits formed inside the substrate, and
the signal transmission circuit includes a first input terminal, a first output terminal, a second input terminal, and a second output terminal
the first output terminal is electrically connected to a first testing pin,
the second output terminal is electrically connected to a second testing pin, and
both the first output terminal and the second output terminal are separately connected to an external testing circuit.

8. A testing probe, comprising:
a first testing pin including a first testing terminal on a top thereof and a first connection terminal on a bottom thereof;
an insulating layer covering a sidewall surface of the first testing pin; and
a second testing pin on a surface of the insulating layer and including a second testing terminal on a top of the second testing pin and a second connection terminal on a bottom of the second testing pin, wherein a first concave surface is formed on a top of the second testing pin, and surrounds the first testing pin; wherein
a top surface of the first testing pin and a top surface of the insulating layer are lower than a surface of the second testing terminal of the second testing pin;
a second concave surface is formed on a surface of the first testing terminal of the first testing pin and the top surface of the insulating layer; and
one edge of the first concave surface is in contact with an edge of the second concave surface, while another edge of the first concave surface is in contact with the top surface of the second testing pin.

9. The testing probe according to claim 8, wherein the first concave surface and the second concave surface are interconnected and coincide with an arc surface of a terminal to be tested on a sphere, ellipsoid, or spheroid.

* * * * *